(12) United States Patent
Shehab et al.

(10) Patent No.: US 11,132,482 B2
(45) Date of Patent: Sep. 28, 2021

(54) TRACKING REFERENCES TO INFORMATION STORAGE RESOURCES IN A QUANTUM CIRCUIT

(71) Applicant: IonQ, Inc., College Park, MD (US)

(72) Inventors: Omar Shehab, College Park, MD (US); Andrew Ducore, College Park, MD (US); Matthew Keesan, College Park, MD (US)

(73) Assignee: IonQ, Inc., College Park, MD (US)

( * ) Notice: Subject to any disclaimer, the term of this patent is extended or adjusted under 35 U.S.C. 154(b) by 53 days.

(21) Appl. No.: 16/255,999

(22) Filed: Jan. 24, 2019

(65) Prior Publication Data

US 2020/0242207 A1 Jul. 30, 2020

(51) Int. Cl.
*G06F 30/30* (2020.01)
*G06N 10/00* (2019.01)

(52) U.S. Cl.
CPC ............. *G06F 30/30* (2020.01); *G06N 10/00* (2019.01)

(58) Field of Classification Search
CPC .............................. G06F 30/30; G06N 10/00
USPC ......................................................... 716/102
See application file for complete search history.

(56) References Cited

U.S. PATENT DOCUMENTS

| | | | |
|---|---|---|---|
| 7,076,596 B1 * | 7/2006 | Keller | G06F 12/0223 711/1 |
| 10,223,084 B1 * | 3/2019 | Dunn | G06N 10/00 |
| 2019/0042677 A1 * | 2/2019 | Matsuura | G06F 30/20 |
| 2019/0378047 A1 * | 12/2019 | Pistoia | G06F 17/14 |
| 2020/0089832 A1 * | 3/2020 | Shao | G06F 30/30 |

* cited by examiner

*Primary Examiner* — Jack Chiang
*Assistant Examiner* — Brandon Bowers
(74) *Attorney, Agent, or Firm* — Brundidge & Stanger, P.C.

(57) ABSTRACT

Technologies are described herein to track information storage resources in a quantum circuit during compile time or runtime of a program by which quantum algorithms are built.

20 Claims, 4 Drawing Sheets

200

TRACKING REFERENCES TO INFORMATION STORAGE RESOURCES IN A QUANTUM CIRCUIT

TECHNICAL FIELD

The embodiments described herein pertain generally to managing resources used in a quantum compiler.

BACKGROUND

Large-scale quantum computers solve certain problems much more quickly than digital computers (alternatively referred to herein as "classical computers"). In the operation of a quantum computer, computations may be initialized by setting quantum bits, or qubits, in a controlled initial state. By manipulating those qubits, predetermined sequences of quantum logic gates are realized that result in a solution to the problem to be solved. These quantum algorithms, such as Shor's algorithm, Simon's algorithm, etc., run more efficiently than their respective classical counterparts.

Based on the inherent advantages in quantum computers in solving certain problems, the challenge is in programming for quantum computers to take advantage of their strengths in an efficient and cost-effective manner.

SUMMARY

In one example embodiment, a classical computer is configured to create a quantum circuit by declaring a qubit and/or bit variable, copying a reference to a circuit type to the declared qubit or bit variable, and assigning at least one qubit or bit from the circuit type associated with the reference to a new circuit type.

This summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
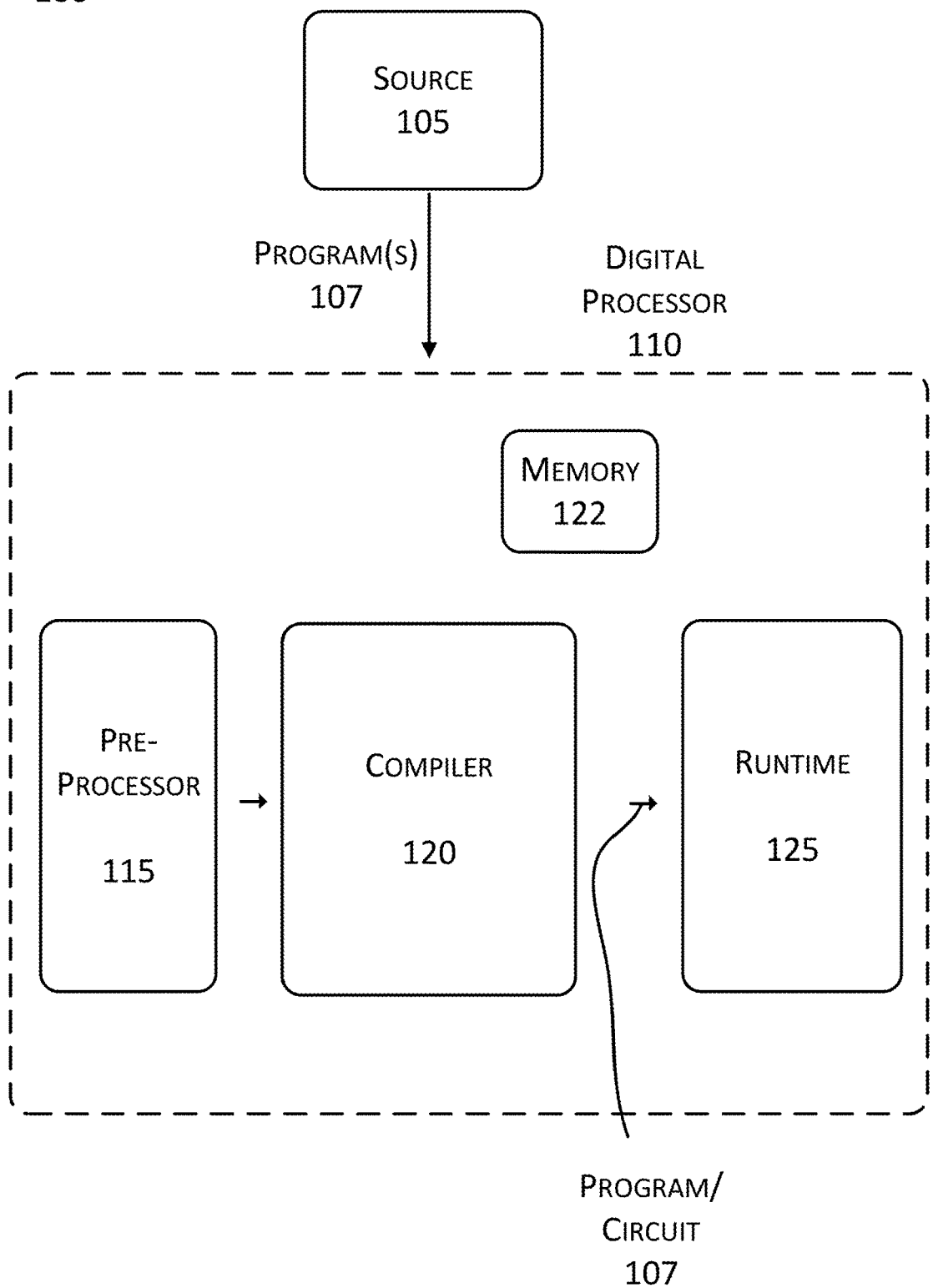
FIG. 1 shows a block diagram representing an example classical computing system by which references to information storage resources in a quantum circuit are tracked in a classical computing environment, arranged in accordance with at least some embodiments described herein.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current example embodiment. Still, the example embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

A quantum computer is a computational system that uses quantum-mechanical phenomena, such as superposition and entanglement, to process data. Unlike digital computers, in which data is encoded into binary digits (bits) in one of two definite states ("0" or "1"), quantum computation requires data to be encoded into binary digits and quantum bits (hereafter "qubits"), for which a single qubit may represent a "1," a "0," or any quantum superposition of the two qubit states. In general, a quantum computer with N qubits may be in an arbitrary superposition of up to $2^N$ different states simultaneously, i.e., a pair of qubits may be in any quantum superposition of four states, and three qubits may be in any superposition of eight states. Accordingly, as referenced herein, a "bit" may refer to a unit of encoding classical information, and a "qubit" may refer to a unit of encoding quantum information.

Described herein are approaches embodied in one or more of systems, apparatuses, applications, programs, and methods by which references to information storage resources in a quantum circuit are tracked when producing quantum algorithms in a classical computing environment.

In the present description, the following terms may be used, in addition to their accepted meaning, as follows:

"Classical computing," "classical program," "digital computing," "digital program," or variations thereof may refer to computing/processing of data that has been converted into binary numbers. Classical computing processors may include, but not be limited to, a central processing unit (CPU), a graphical processing unit (GPU), a tensor processing unit (TPU), application-specific integrated circuits (ASICs), field programmable gate arrays, etc., and unbound permutations thereof. Non-limiting examples thereof may include a classical optimization function that may be parallelized and run on a multicore classical computer; a classical computer with a GPU for performing parallel calculations, etc.

"Quantum computing," or variations thereof, may refer to computing/processing of data that has been encoded into bits and qubits. Quantum computing utilizes bits and qubits to perform computations to produce results that can be dramatically faster than classical computing or make classically computationally intractable problems tractable. The embodiments described herein certainly contemplate implementation in even faster and more efficient quantum computing systems as technologies evolve. Accordingly, "storage resources" may refer to bits and qubits.

"Environment" may refer to a computing environment in which are found components that, when executing a program, may utilize, e.g., utilities such as libraries, other programs, other hardware, etc. Thus, reference may be made herein to a classical computing environment, a quantum computing environment, etc.

A "circuit" may refer to quantum function included in a quantum algorithm or program. The name historically comes from quantum algorithms being expressed as a series of classical and quantum logic gates, analogous to classical logic gates in traditional circuit design.

In accordance with the example embodiments described herein, quantum computing may include executing iterative processes by which one or more quantum circuits may be written in a classical computing environment for execution in a quantum computing environment. Non-limiting examples of such classical computing environment that can be used include a desktop computer, a laptop computer, mobile device, a virtual-reality environment, etc. The quantum circuit may be submitted via a network, e.g., the Internet, to a quantum computing device at which the one or more quantum circuits may be queued with other quantum circuits, similar to, for example, batch processing for a mainframe computing device. The queued quantum circuits may be executed in turn.

Quantum circuits, which are a set of inter-connected bits and qubits, are an expression of quantum information processing algorithms, which are generally designed in terms of operations without reference to specific hardware, i.e., logical gates as opposed to physical gates. For a given quantum circuit that implements an algorithm, there may be many other circuit implementations that express the same algorithm or that are similar within a global phase factor.

That is, for every quantum circuit, a unitary matrix, which is a square matrix of complex numbers, may be computed. If the outputs of two quantum circuits are equivalent, the unitary matrices are not necessarily equivalent; however, there will always be a number, global phase, that, when multiplied by one matrix, will produce the other matrix.

Although measured output from these other circuit plementations would be the same in ideal conditions, their respective performance characteristics may differ when implemented by actual hardware. Therefore, described herein are apparatuses, components, systems, methods, and programs pertaining to facets of classical computing by which a quantum circuit is transformed into a logically identical representation that is more appropriate for quantum processing.

When programming for execution on a classical computer, a program is coded to run in a single execution context. Therefore, an object in memory will always have a fixed address that is constant for the lifetime of the program, even if the object does not always exist. However, when programming for execution on a quantum computer, a quantum algorithm may be coded to execute in different contexts on the quantum computer. For example, source code may be executed in a classical computing environment to produce a single instance of a quantum algorithm, i.e., quantum program, to run on a quantum computer or multiple instances of a quantum algorithm to run serially on the quantum computer, each building on the previous quantum algorithm. Thus, quantum algorithms, e.g., quantum programs, have instances of information storage resources in a quantum circuit that are produced by the classical program and that are referenced in different levels of abstraction of the respective quantum algorithm.

Therefore, the objective is to keep track of the information storage resources in a quantum circuit in these quantum programs that are produced from within the classical program, which is an issue that does not exist in a classical setting, FIG. 1 shows a block diagram representing an example classical computing system by which information storage resources in a quantum circuit may be tracked for subsequent utilization in the same quantum algorithm, arranged in accordance with at least some embodiments described herein. As depicted, configuration 100 includes at least a program source 105, program(s) 107, and digital processor 110. Digital processor 110 may include, at least, pre-processor 115, compiler 120, memory 122, and runtime environment 125.

Source 105 may refer to one of multiple servers, on the order of hundreds to thousands, that may be hosted on a cloud-based infrastructure via which program(s) 107 may be received from a user or user entity over a network. Source 105 may be further configured to receive and/or store partial or complete results of the execution of program(s) 107 and return such results to the user or user entity, also via the network. Further, source 105 may be implemented by single or multiple classical computers, and program(s) 107 may be transmitted across single or multiple connections or channels.

Program(s) 107 may refer to one or more programs received from a user or user entity, via source 105. Program (s) 107 may include at least one or more quantum circuits written or programmed in a classical environment intended for execution in a quantum computing environment. Respective ones of program(s) 107 may be written or programmed in-part or entirely in a quantum computing language, include only quantum circuits, or include quantum circuits in combination with classical computing functions. Unless context otherwise requires, the description will continue with reference to a single embodiment of program 107, but without excluding embodiments and implementations that include multiple programs.

Program 107 may be regarded as a collection of bits and qubits having a series of instructions on the respective bits and qubits. That is, program 107, to be executed in a quantum computing environment, is a series of gates.

Further, as previously referenced, program 107 may include multiple circuits that are collectively composed into a single quantum program; and tracking information storage resources in a quantum circuit, as disclosed and recited herein, includes correlating bits and qubits from one circuit to another. That is, within the context of multiple circuits, for coding purposes, it may be helpful to divide the multiple circuits into modules for the sake of efficiency and control. However, at some point, the modules must be combined to produce the singular quantum program, which is when conflicts between references to information storage resources in a quantum circuit are likely to occur since, when coding program 107, in a first stage, instructions that make up a second program are produced. The second program includes references to the information storage resources in a quantum circuit in the first program.

As further context, in quantum programming, but not necessarily in classical programming, program 107 is written to generate another program. That is, the first program describes the second program, and includes instructions for how to write, or synthesize, the quantum program. These generated quantum programs may be constructed via a process in which the first program creates multiple smaller quantum programs and then issues instructions to combine these multiple smaller programs by adding them into a larger quantum program.

In some applications, the same smaller quantum program may be added multiple times to the larger quantum program, either to operate repeatedly on the same qubits, or to perform the same computation on multiple different sets of qubits in the larger program. Moreover, these smaller quantum programs may consistently use the same qubits from the larger quantum program as some of their inputs, while the other input qubits to the smaller program vary each time it is added to the larger quantum program. To facilitate the expressive power of a quantum programming language and to simplify the code required to write such a program, the quantum programming language allows the smaller quantum program to differentiate between the qubits that do not vary between additions and those that do vary between additions, so that the overall program does not need to repeatedly specify the qubits that do not vary each time the smaller quantum program is added, but instead have the language automatically apply these non-varying qubits when the quantum program is added so that the program only specifies the qubits that do vary.

While similar to parameter currying in classical programming languages, there are differences between classical compilation and quantum program synthesis. In classical programming, parameters have addresses in memory that exist at the time that the program executes, whereas quantum program synthesis occurs before execution of the quantum program on a quantum processor, so addresses cannot be resolved during synthesis. Also, in a classical program, subprograms, which may also be referred to as functions, are included once, and the classical program includes instructions to execute the subprogram at each point that it is needed. Conversely, in quantum programs practical considerations require that, rather than include instructions to execute a single subprogram each time it s needed, the entire subprogram may be included each time it is needed instead. For at least these reasons, while the problem faced are similar to parameter currying in classical programs, the existing solutions for classical programs cannot be applied to quantum programs, and a new solution is required.

Digital processor 110 may refer to one or more embodiments of a classical computing environment that may be, or include, a classical computer, processing device, a microprocessor, a microcontroller, a digital signal processor, or any combination thereof, on which program 107 is assembled, managed, compiled, and/or executed. Digital processor 110 may refer to a high-performance computing (HPC) environment that includes, at least, a CPU and GPU that is present on a, e.g., a video card, embedded on a motherboard, or on the CPU die. Tracking of references to information storage resources in a quantum circuit, according to embodiments described herein, may be executed entirely on the CPU or in part on the CPU and the G?U. Alternative embodiments may be executed in evolved HPC components equivalent to those described herein.

Pre-processor 115 may refer to a program that is designed, programmed, or otherwise configured to modify input data to conform with input requirements of another program. In accordance with the embodiments described herein, the input to pre-processor 115 includes at least portions of program 107, which may include one or more quantum circuits. The output may be referred to as a preprocessed form of the input data, i.e., program 107, that may be used or executed by other programs on digital processor 110. In accordance with the embodiments described herein, pre-processor 115 may pre-process or otherwise translate the source code by which program 107 is written in preparation for compilation.

Compiler 120 may refer to a compiler that is designed, programmed, or otherwise configured to render at least portions of program 107 suitable for execution in a quantum environment. As is known in the art, compilers may execute operations that promote efficient design and correct transformations of source input to target output. Thus, compiler 120 may be designed, programmed, or otherwise configured to minimize or maximize some attributes of program 107, i.e., reduce quantum cost of computation.

In accordance with at least some embodiments described herein, compiler 120 may be designed, programmed, or otherwise configured, in part, to track references to information storage resources to transform quantum circuits, of one or more layers of abstraction, included in program 107 into, respectively, a corresponding quantum circuit that is semantically equivalent but at a lower quantum cost. Further, compiler 120 may track references to information storage resources in a quantum circuit in either a centralized manner or a distributed manner, as will be described further herein.

Memory 122 may refer to computer data storage, associated with digital processor 110, that stores data and machine code currently use for program 107. As a non-limiting example, memory 122 may refer to a random-access memory (RAM) that stores, among other data, a central table of references to physical resources, e.g., bits and qubits, for use in producing further layers of program 107. Such references are advantageous since program 107 is a quantum program that includes a collection of circuits, and therefore the bits and qubits for the respective circuits need to be correlated from one circuit to another without conflict.

Runtime 125 may refer to the runtime environment (RTE) for program 107. Runtime 125 may be designed, programmed, or otherwise configured to, e.g., access system resources such as memory 122, send instructions or commands to other system resources, etc. That is, runtime 125 provides a state for digital processor 110 to access resources, e.g., a central reference table on memory 122, to provide services and support to processes involved in execution of program 107.

In accordance with some embodiments described herein, runtime 125 may be designed, programmed, or otherwise configured, in part, to track references to information storage resources to transform quantum circuits, of one or more layers of abstraction, included in program 107 into, respectively, a corresponding quantum circuit that is semantically equivalent but at a lower quantum cost. Further, references to information storage resources in a quantum circuit may be tracked within runtime 125 in either a centralized manner or a distributed manner, as will be described further herein.

As set forth above, program 107 is a quantum program, which invariably includes complex structures or patterns, and therefore has multiple layers of abstractions. Using custom operators, references to physical or variable bits and qubits to newly declared variables are copied, thus facilitating program designs by creating aliases. That is, program 107 may include a bit or qubit variable, and bits and qubits from a previously declared bit or qubit variable may be assigned. Thus, execution of program 107 requires, for error-free execution, that a bit or qubit not appear more than once in the application of a quantum gate. Therefore, compiler 120 and runtime 125, in accordance with the embodiments described herein, track all alias declarations, i.e., references, for a physical bit or qubit variable.

Tracking of information storage resources in a quantum circuit may be implemented during compile time and/or runtime, in accordance with the embodiments described herein. As time or contextual references, "compile time" may refer to the stage of life cycle of program 107 when source code is translated to an immediate proceeding representation; and "runtime" may refer to the stage of life cycle of program 107 when the computational work defined by the source code is performed by processor 110.

Figure 3A:
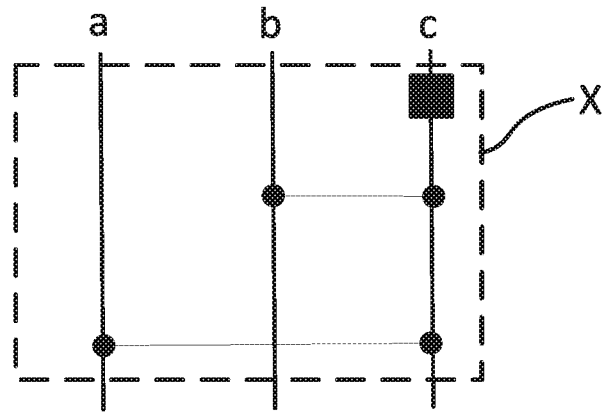
FIG. 3A shows an example implementation of a quantum circuit produced in a classical computing environment, arranged in accordance with at least some embodiments described herein.
Figure 3B:
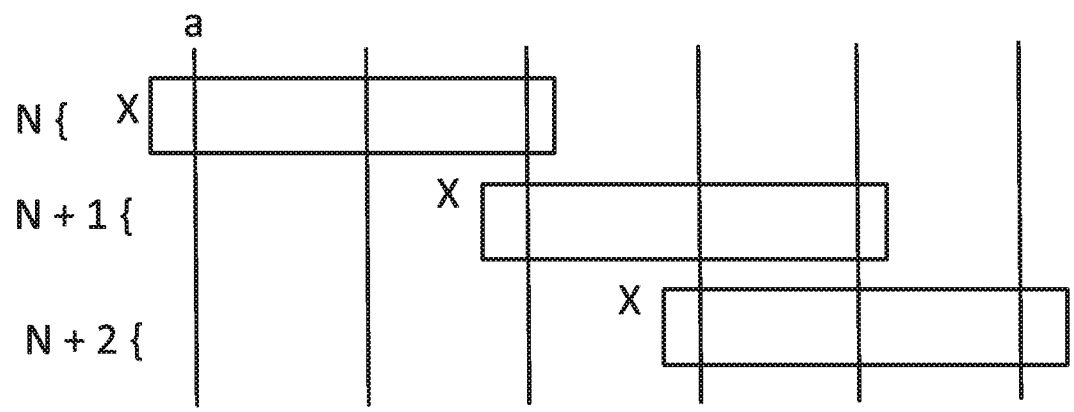
FIG. 3B shows the example implementation of the quantum circuit as in FIG. 3A being applied to a higher level of abstraction.
Figure 3C:
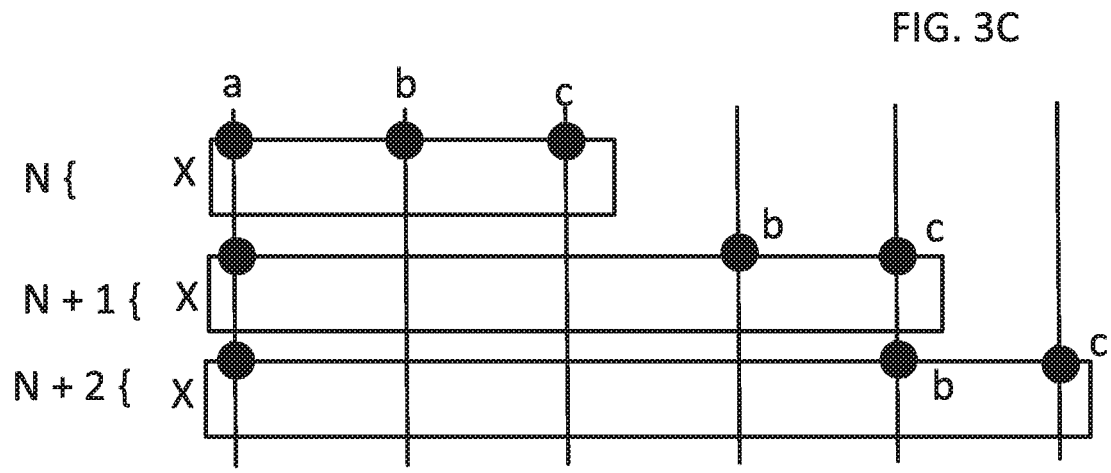
FIG. 3C shows the example implementation of the quantum circuit of FIG. 3A being applied to a higher level of abstraction.

Reference may now be made to FIGS. 3A-3C, which show example representations of quantum circuits produced in a classical environment, arranged in accordance with at least some embodiments described herein. In accordance with at least one embodiment, FIG. 3A shows circuit X, which may be considered as a building block for a larger circuit, on which all inputs are hard-coded. That is, X is fully curried, with the operations, i.e., gates, for qubits a, b, and c being set, and may be referred to as a "template" for the purpose of tracking information storage resources in a quantum circuit. As referenced herein, "currying" and derivatives thereof may refer to the transforming of a function into a function of fewer arity.

FIGS. 3B and 3C show X being respectively applied to subsequently higher levels of abstraction N+1 and N+2, abstractly and more specifically. For such implementation, compiler 120 may be designed, programmed, or otherwise configured to track references to information storage resources in a quantum circuit, e.g., bits and qubits, when variable binding and scope resolution of a circuit may be done in-full during compile time. Thus, compiler 120 may create an address table in memory 122, in which each row lists physical indices of respective bits and qubits. The columns of the table list variable names, i.e., references, which are aliases for a given physical bit or qubit. For a distributed system, the bit and qubit addresses are fully qualified addresses. During semantic analysis, the compiler resolves each variable declaration of bits and qubits and populate the corresponding column.

References may be tracked in two different ways based on how a respective reference is stored, i.e., in a centralized manner or a distributed manner. Tracking may also be implemented in two different ways based on when the tracking is resolved, i.e., during compile time or during run time. Thus, there may be four permutations, including centralized compile time tracking, distributed compile time tracking, centralized runtime tracking, and central compile time tracking.

By the compile-time tracking of information storage resources in a quantum circuit, as described above, absolute fully qualified addresses to all bit and qubit variables may be resolved during compile time. Thus, determining whether a gate is being applied on a valid set of qubits runs efficiently on during runtime. However, time required for compilation of a program may increase proportionally with the number of bits and qubits as well as complex layers of abstractions.

In accordance with at least one other embodiment, runtime 125 may be designed, programmed, or otherwise configured to track references to information storage resources in a quantum circuit, e.g., bits and qubits, using reference trees. That is, while the compiler parses the program, an explicitly declared bit or qubit variable may be associated with an absolute fully qualified address for the corresponding bit or qubit. Such references serve as root nodes of the reference trees. Accordingly, if a bit or qubit variable is declared by referring to a previously declared variable, a leaf node for the new bit or qubit may be added to the referred bit or qubit variable, i.e., a root or parent node, which is already in the table.

By runtime tracking of information storage resources in a quantum circuit, compiler 120 does not completely resolve the absolute fully qualified addresses while parsing program 107, compiling thereof may be executed more efficiently. Further, quality control may be executed more efficiently, as well, since only portions of a reference tree need be traversed. However, when program 107 has an increasingly large number of layers of abstraction, traversing most or all of a reference tree to identify a potential conflict weighs down the efficiency of the compiling to a notable degree.

Runtime tracking of information storage resources in a quantum circuit may also be implemented in a distributed manner, by which no central data structure is maintained to resolve absolute fully qualified addresses. Rather, each bit or qubit has its own data structure, which contains the absolute fully qualified addresses. The absolute fully qualified addresses may be resolved dynamically when the quantum program is executed in the runtime environment.

The techniques described herein may also be applied to a partially-curried circuit, i.e., when bit or qubit inputs to X are partially templated. By such embodiments, X may not be unbound in relation to the higher levels of abstraction for program 107. Therefore, for example, qubit a of X may be designated as corresponding to qubit a on level N+1 and N+2, Further, addresses for un-curried bits and qubits may be resolved into fully qualified addresses on a temporary basis. Such bits and qubits may be curried while X is applied on a higher level of abstraction for program 107, those un-curried bits and qubits may be mapped to physical bits and qubits as described above, either by compile-time tracking or runtime tracking.

In at least one embodiment, a qubit within X (as shown in FIG. 3A) might not be specified as an input or correlated to a particular qubit on level N+1 or even N+2 (as shown in FIG. 3B). Accordingly, on those higher levels of abstraction, auxiliary bits and qubits may be allocated for X and then discarded after computation. Resolving addresses of auxiliary bits and qubits, in both compile time and runtime, may include a respective circuit maintaining auxiliary contexts that are mapped to bits and qubits, and then resolving addresses as described above, either by compile-time tracking or runtime tracking.

Figure 2:
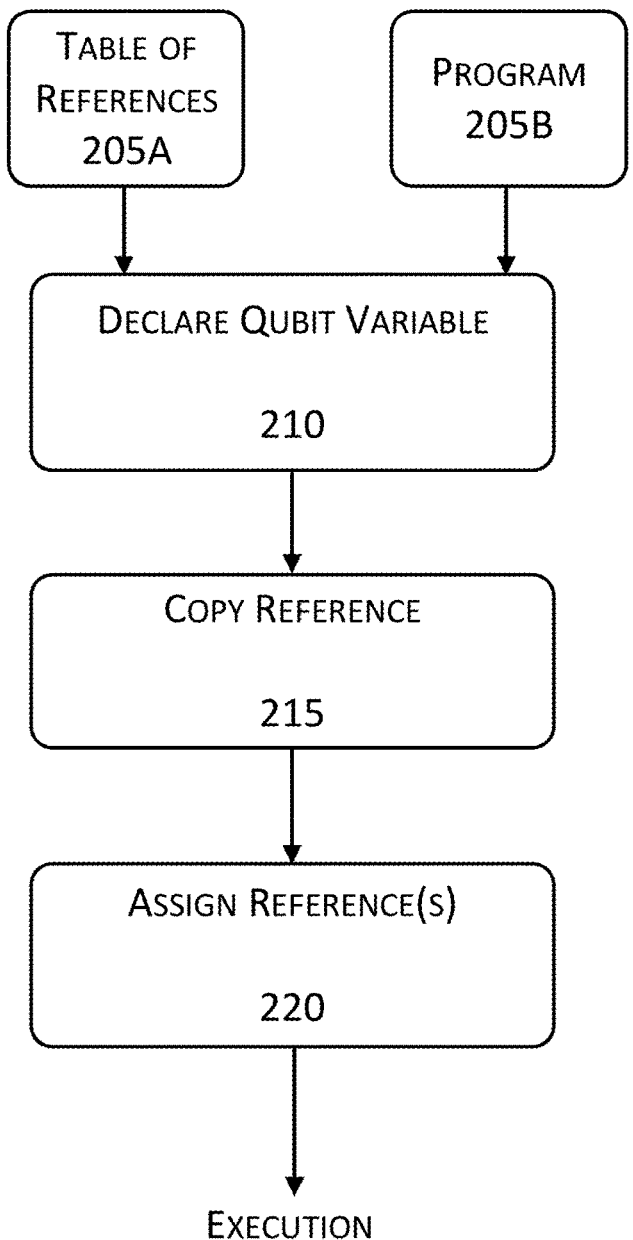
FIG. 2 shows an example processing flow to track references to information storage resources in a quantum circuit in a classical computing environment, arranged in accordance with at least some embodiments described herein.

FIG. 2 shows an example processing flow 200 to track references to information storage resources in a quantum circuit in a classical computing environment, in accordance with at least the system embodiment of FIG. 1 as well as the example circuits of FIG. 3, described above. As depicted, processing flow 200 includes sub-processes executed by various components of digital processor 110 that may be included in system 100. However, processing flow 200 is not limited to such components, as obvious modifications may be made by re-ordering two or more of the sub-processes described here, eliminating at least one of the sub-processes, adding further sub-processes, substituting components, or even having various components assuming sub-processing roles accorded to other components in the following description. Processing flow 200 may include various operations, functions, or actions as illustrated by one or more of blocks 205A, 205A, 210, 215, and 220. These various operations, functions, or actions may, for example, correspond to software, program code or program instructions executable by a processor that causes the functions to be performed. Processing may begin at either or both of block 205A or block 205B.

At block 205A (Table of References), compiler 120 may create a dynamic address table in memory 122, in which each row lists physical indices of respective qubits in circuit X. The columns of the table may include variable names, i.e., references, which are aliases for a given physical bit or qubit.

At block 205B (Program), program 107 may be received, directly or indirectly, from source 105.

In accordance with the embodiments described herein, processing at block 205A and block 205B may be implemented concurrently or serially or with no predetermined order. Processing may proceed to block 210.

At block 210 (Declare Qubit Variable), compiler 120 may parse declarations of variables of type bit or qubit from program 107. Processing may proceed to block 215.

At block 215 (Copy Reference), compiler may associate references to physical bits and qubits directly, as well as update the table of references in memory 122. Processing may proceed to block 220.

At block 220 (Assign Reference(s)), references to information storage resources in a quantum circuit may be tracked in compile time or runtime, as described above.

That is, compiler 120 may access the address table in memory 122, in which each row lists physical indices of respective hits and qubits and, during semantic analysis, resolve each variable declaration of bits and qubits per the table. Thus, absolute fully qualified addresses to all bit and qubit variables may be resolved during compile time. In addition, or alternatively, in runtime 125, if a bit or qubit variable is declared by referring to a previously declared variable, a leaf node already in the table in memory 122 may be referenced. Processing may proceed to execution of program 107.

As set forth above, by compile-time tracking, when compiler 120 sees a new reference, the reference is immediately resolved to the absolute address of the corresponding bit or qubit, by referring to the table of references to the bits and qubits, stored in memory 122. Compilation includes resolving all references before executing program 107. By runtime tracking of information storage resources in a quantum circuit, compiler 120 does not completely resolve the absolute fully qualified addresses while parsing program 107, and therefore compiling of a current level of abstraction for program 107 may be executed more efficiently.

Figure 4:
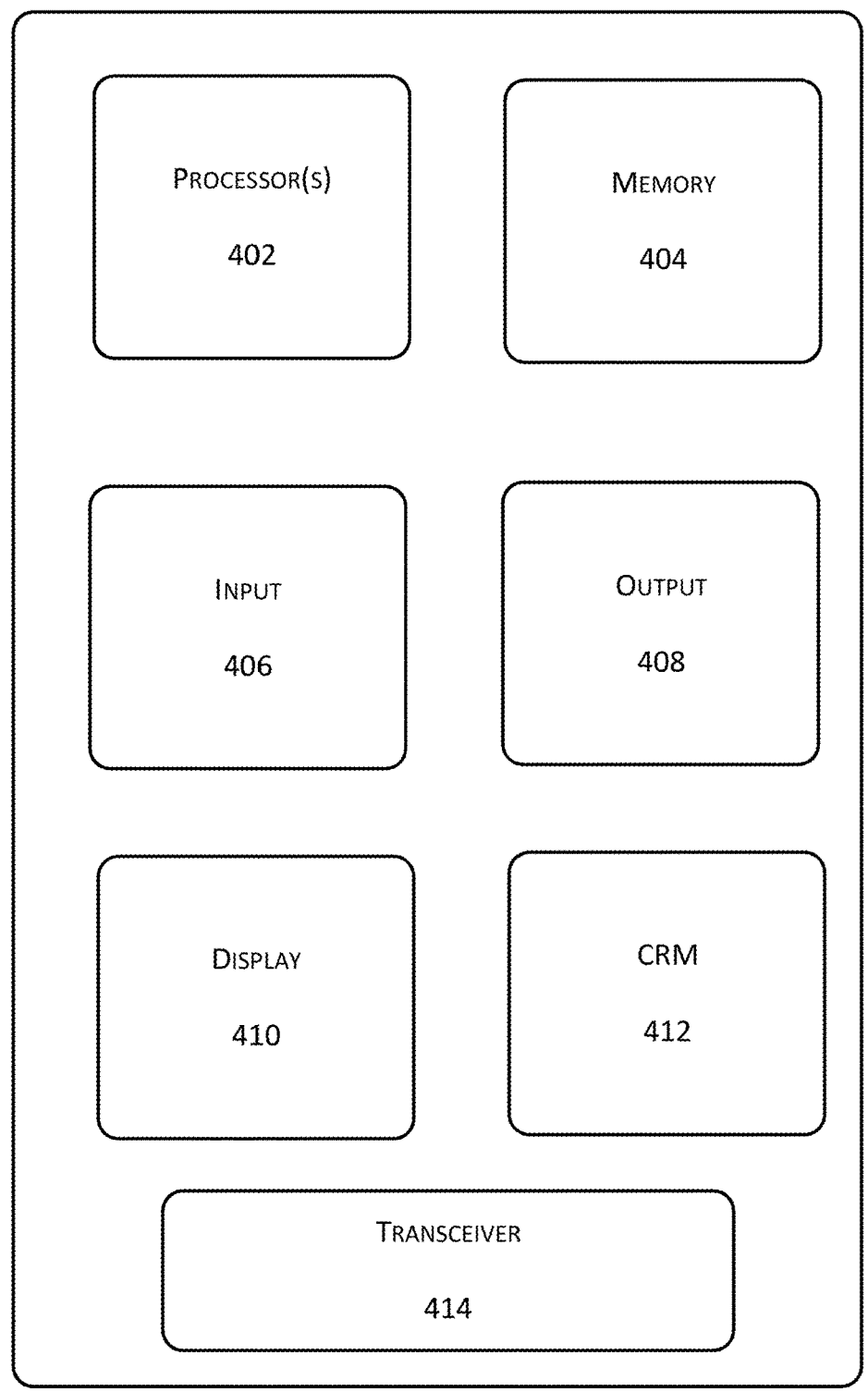
FIG. 4 shows an illustrative computing embodiment, in which any of the processes and sub-processes of optimizing a quantum circuit may be implemented as executable instructions stored on a computer-readable medium.

FIG. 4 shows an illustrative computing embodiment, in which any of the processes and sub-processes of optimizing a quantum circuit may be implemented as computer-readable instructions stored on a computer-readable medium. The computer-readable instructions may, for example, be executed by a processor of a device, as referenced herein, having a network element and/or any other device corresponding thereto, particularly as applicable to the applications and/or programs described above corresponding to systems 100 and 200 for quantum hybrid computation.

In a very basic configuration, a computing device 400 may typically include, at least, one or more processors 402, a system memory 404, one or more input components 406, one or more output components 408, a display component 410, a computer-readable medium 412, and a transceiver 414.

Processor 402 may refer to, e.g., a microprocessor, a microcontroller, a digital signal processor, or any combination thereof, akin to digital processor 110 described in accordance with FIG. 1.

Memory 404 may refer to, e.g., a volatile memory, non-volatile memory, or any combination thereof. Memory 404 may store, therein, operating system 130, an application, and/or program data. That is, memory 404 may store executable instructions to implement any of the functions or operations described above and, therefore, memory 404 may be regarded as a computer-readable medium.

Input component 406 may refer to a built-in or communicatively coupled keyboard, touch screen, or telecommunication device. Alternatively, input component 406 may include a microphone that is configured, in cooperation with a voice-recognition program that may be stored in memory 404, to receive voice commands from a user of computing device 400. Further, input component 406, if not built-in to computing device 400, may be communicatively coupled thereto via short-range communication protocols including, but not limitation, radio frequency or Bluetooth.

Output component 408 may refer to a component or module, built-in or removable from computing device 400, that is configured to output commands and data to an external device.

Display component 410 may refer to, e.g., a solid state display that may have touch input capabilities. That is, display component 410 may include capabilities that may be shared with or replace those of input component 406.

Computer-readable medium 412 may refer to a separable machine-readable medium that is configured to store one or more programs that embody any of the functions or operations described above, That is, computer-readable medium 412, which may be received into or otherwise connected to a drive component of computing device 400, may store executable instructions to implement any of the functions or operations described above. These instructions may be complimentary or otherwise independent of those stored by memory 404.

Transceiver 414 may refer to a network communication link for computing device 400, configured as a wired network or direct-wired connection. Alternatively, transceiver 414 may be configured as a wireless connection, e.g., radio frequency (RF), infrared, Bluetooth, and other wireless protocols.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

We claim:

1. A non-transitory computer-readable medium storing executable instructions that, upon execution, cause a digital computing processor to create a quantum circuit by performing functions comprising:
    declaring a qubit variable; copying a reference, comprising an alias created in a dynamic address table stored in a memory for a circuit type of a quantum circuit, to the declared qubit variable;
    creating a new circuit type of a quantum circuit; and
    assigning at least one qubit from the circuit type associated with the reference to the newly created circuit type.

2. The non-transitory computer-readable medium of claim 1, wherein the computer-readable medium comprises a compiler executing in a classical computing environment.

3. The non-transitory computer-readable medium of claim 1, wherein the newly created circuit type is a quantum circuit that is executable in a quantum computing environment.

4. The non-transitory computer-readable medium of claim 1, wherein the newly created circuit type is of a higher level of abstraction than the circuit type.

5. The non-transitory computer-readable medium of claim 1, wherein the copying includes referring to a central table that maps references addresses of qubits.

6. The non-transitory computer-readable medium of claim 5, wherein the circuit type is fully-curried and the assigning includes assigning all the qubits from the circuit type to the newly created circuit type.

7. The non-transitory computer-readable medium of claim 5, wherein the circuit type is partially-curried and the assigning includes resolving addressing of un-curried qubits from the circuit type into qualified qubit addresses corresponding to the newly created circuit type.

8. The non-transitory computer-readable medium of claim 5, wherein a qubit corresponding to the circuit type is not correlated to a qubit corresponding to the newly created circuit type, and the assigning includes assigning an auxiliary qubit to the circuit type within the newly created circuit type.

9. The non-transitory computer-readable medium of claim 1, wherein the copying includes retrieving, from a local memory, a qubit address that is tagged to the reference.

10. The non-transitory computer-readable medium of claim 9, wherein the circuit type is fully-curried and the assigning includes assigning all the qubits from the circuit type to the newly created circuit type that pertains to an immediately higher level of abstraction.

11. The non-transitory computer-readable medium of claim 9, wherein the circuit type is partially-curried and the assigning includes resolving addressing of un-curried qubits from the circuit type into qualified qubit addresses associated with the newly created circuit type that pertains to an immediately higher level of abstraction.

12. The non-transitory computer-readable medium of claim 9, wherein a qubit associated with the circuit type is not correlated to a qubit associated with the newly created circuit type, and the assigning includes assigning an auxiliary qubit to the circuit type within context of the newly created circuit type that pertains to an immediately higher level of abstraction.

13. A method of creating a quantum circuit in a classical computing environment, comprising:
    declaring at least a qubit variable;
    copying a reference, comprising an alias created in a dynamic address table stored in a memory for a circuit type of a quantum circuit, to at least the declared qubit variable;
    creating a new circuit type of a quantum circuit; and
    assigning at least one qubit from the circuit type associated with the reference to the newly created circuit type.

14. The method of claim 13, wherein the newly created circuit type is a quantum circuit that is executable in a quantum computing environment and is of a higher level of abstraction than the circuit type.

15. The method of claim 13, wherein the copying includes referring to a central table that maps references addresses of at least qubits.

16. The method of claim 15, wherein the circuit type is a fully-curried template for which at least all corresponding qubits are pre-assigned to at least qubits corresponding to the newly created circuit type.

17. The method of claim 15, wherein the circuit type is a partially-curried template for which at least one corresponding qubit is pre-assigned to at least a qubit corresponding to the newly created circuit type, and the assigning includes resolving addressing of at least remaining qubits from the circuit type into at least qualified qubit addresses corresponding to the newly created circuit type.

18. The method of claim 15, wherein at least a qubit corresponding to the circuit type is not correlated to at least a qubit corresponding to the newly created circuit type, and the assigning includes assigning at least an auxiliary qubit to the circuit type within the newly created circuit type.

19. The method of claim 15, wherein the copying includes retrieving, from a local memory, at least a qubit address that is tagged to the reference.

20. The method of claim 19, wherein the reference pertains to an immediately higher level of abstraction.

* * * * *